(12) United States Patent
Song et al.

(10) Patent No.: US 9,048,454 B2
(45) Date of Patent: Jun. 2, 2015

(54) ORGANIC LIGHT EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Jung-Bae Song, Yongin (KR); Jin-Wook Jeong, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/061,324

(22) Filed: Oct. 23, 2013

(65) Prior Publication Data

US 2014/0346459 A1 Nov. 27, 2014

(30) Foreign Application Priority Data

May 21, 2013 (KR) .................. 10-2013-0057299

(51) Int. Cl.

| H01L 29/08 | (2006.01) |
|---|---|
| H01L 35/24 | (2006.01) |
| H01L 51/00 | (2006.01) |
| H01L 29/04 | (2006.01) |
| H01L 29/10 | (2006.01) |
| H01L 31/036 | (2006.01) |
| H01L 31/0376 | (2006.01) |
| H01L 31/20 | (2006.01) |
| H01L 29/15 | (2006.01) |
| H01L 51/52 | (2006.01) |
| H01L 51/56 | (2006.01) |
| H01L 27/32 | (2006.01) |

(52) U.S. Cl.
CPC ............ *H01L 51/5228* (2013.01); *H01L 51/56* (2013.01); *H01L 27/3276* (2013.01); *H01L 51/5203* (2013.01)

(58) Field of Classification Search
CPC .................... H01L 27/3276; H01L 51/5203
USPC ................... 257/40, 59, 72, E51.018
See application file for complete search history.

(56) References Cited

U.S. PATENT DOCUMENTS

| 5,618,216 A * | 4/1997 | Potter ............................. 445/24 |
|---|---|---|
| 5,729,308 A * | 3/1998 | Yamazaki et al. .............. 349/39 |
| 6,362,507 B1 * | 3/2002 | Ogawa et al. ................. 257/350 |

(Continued)

FOREIGN PATENT DOCUMENTS

| JP | 2003-123988 | 4/2003 |
|---|---|---|
| JP | 2005-011810 | 1/2005 |

(Continued)

*Primary Examiner* — Ida M Soward
(74) *Attorney, Agent, or Firm* — F. Chau & Associates, LLC (57) ABSTRACT

An organic light emitting display apparatus includes pixel electrodes formed on a substrate for respective pixels. Auxiliary electrodes are formed on at least parts of the periphery of the pixel electrodes. A first organic function layer is formed on the substrate and covers the pixel electrodes and the auxiliary electrodes. An emissive layer is formed on the first organic function layer for the respective pixels. A second organic function layer is formed on the substrate and covers the emissive layer. A cathode electrode is formed on the entire substrate and faces the pixel electrodes and covers the second organic function layer. Secondary cathode electrodes are formed, on at least parts of the auxiliary electrodes, in contact with the cathode electrode through a contact hole.

20 Claims, 9 Drawing Sheets

(56) References Cited

U.S. PATENT DOCUMENTS

| | | | |
|---|---|---|---|
| 6,531,713 B1* | 3/2003 | Yamazaki | 257/59 |
| 7,880,380 B2* | 2/2011 | Yamazaki et al. | 313/506 |
| 7,952,542 B2* | 5/2011 | Yamashita et al. | 345/76 |
| 8,164,258 B2* | 4/2012 | Hayashi et al. | 313/512 |
| 8,237,631 B2* | 8/2012 | Tanikame | 345/76 |
| 8,304,777 B2* | 11/2012 | Omoto | 257/59 |
| 8,514,165 B2* | 8/2013 | Yoshida | 345/102 |
| 2004/0253756 A1 | 12/2004 | Cok et al. | |
| 2008/0246403 A1* | 10/2008 | Sagawa et al. | 315/35 |
| 2010/0102335 A1 | 4/2010 | Takagi et al. | |
| 2011/0108842 A1* | 5/2011 | Yamazaki et al. | 257/59 |

FOREIGN PATENT DOCUMENTS

| | | |
|---|---|---|
| JP | 2006-286493 | 10/2006 |
| JP | 2010-108693 | 5/2010 |

* cited by examiner

ORGANIC LIGHT EMITTING DISPLAY APPARATUS AND METHOD OF MANUFACTURING THE SAME

CROSS-REFERENCE TO RELATED PATENT APPLICATION

This application claims the benefit of Korean Patent Application No. 10-2013-0057299, filed on May 21, 2013, in the Korean Intellectual Property Office, the disclosure of which is herein incorporated by reference in its entirety.

TECHNICAL FIELD

The present invention relates to a display, and more specifically, to an organic light emitting display apparatus and a method of manufacturing the same.

DISCUSSION OF THE RELATED ART

Organic light emitting display apparatuses have wide viewing angles and excellent contrasts. Additionally, these display apparatuses have fast response times.

The organic light emitting display apparatuses include an organic layer, including a light emitting layer, between a pixel electrode and a cathode electrode which face each other. The cathode electrode is a common electrode and it applies the same voltage to all pixels. A voltage drop (IR drop) occurs within the cathode electrode due to a high specific resistance therein, and thus different voltages are applied to respective pixels according to pixel locations.

Particularly, in top emission type organic light emitting display apparatuses, a cathode electrode functions as a transmission layer and the cathode electrode is formed of a transparent material having a small thickness and a high specific resistance to increase transmittance of light. Accordingly, due to high resistance, voltage drop increases at the cathode electrode. Particularly, in medium-large sized top emission type organic light emitting display apparatuses, voltage drops are intensified at a cathode electrode, thereby causing nonuniformity in image quality and properties.

SUMMARY OF THE INVENTION

The present invention provides an organic light emitting display apparatus conducive for a process of mass-producing large-sized substrates and capable of reducing voltage drops at a cathode electrode and a method of manufacturing the same.

According to an aspect of the present invention, there is provided an organic light emitting display apparatus including pixel electrodes formed on a substrate for respective pixels and auxiliary electrodes, wherein an auxiliary electrode is formed on at least a part of a periphery of each of the pixel electrodes, a first organic function layer formed on the entire substrate while covering the pixel electrodes and the auxiliary electrodes, emissive layers formed on the first organic function layer, for each of the respective pixels, a second organic function layer formed on the entire substrate while covering the emissive layers, a cathode electrode formed on the entire substrate while facing the pixel electrodes and covering the second organic function layer, and secondary cathode electrodes. A secondary cathode electrode is formed on at least a part of each auxiliary electrode that is in contact with the cathode electrode through a contact hole.

The secondary cathode electrodes may be formed on the cathode electrode.

The cathode electrode and the auxiliary electrodes may be electrically connected to one another by radiating a laser beam to the secondary cathode electrodes.

The each of the secondary cathode electrodes may be formed between each of the auxiliary electrodes and the cathode electrode.

The cathode electrode and the auxiliary electrodes may be electrically connected to one another through the secondary cathode electrodes by radiating a laser beam to the cathode electrode.

The auxiliary electrodes and the pixel electrodes may be formed on a same plane.

The organic emissive layers may be formed in a pattern of islands, and the auxiliary electrodes may be formed in a linear pattern between columns of organic emissive layers.

The organic emissive layers may be formed in a linear pattern, and the auxiliary electrodes may be formed in a linear pattern between columns of the organic emissive layers.

The organic light emitting display apparatus may further include a pixel definition layer formed between adjacent pixel electrodes. At least parts of the auxiliary electrodes may be exposed by the contact holes formed in the pixel definition layer.

The contact hole may be formed on the periphery of the organic emissive layer.

According to an aspect of the present invention, there is provided a method of manufacturing an organic light emitting display apparatus. The method includes forming pixel electrodes on a substrate for respective pixels. Auxiliary electrodes are formed. An auxiliary electrode is formed on at least a part of a periphery of each of the pixel electrodes. A first organic function layer is formed on the entire substrate while covering the pixel electrodes and the auxiliary electrodes. An organic emissive layer is formed on the first organic function layer. For each of the respective pixels, a second organic function layer is formed on the entire substrate while covering the organic emissive layer. A cathode electrode is formed on the entire substrate. The cathode electrode is formed facing the pixel electrodes and the cathode electrode covers the second organic function layer. Secondary cathode electrodes are formed. A secondary cathode electrode is formed on at least a part of each auxiliary electrode that is in contact with the cathode electrode through a contact hole.

The forming of the secondary cathode electrodes may include forming the secondary cathode electrodes on the cathode electrode.

The method may further include electrically connecting the cathode electrode and the auxiliary electrodes to one another by radiating a laser beam to the secondary cathode electrodes.

The forming of the secondary cathode electrodes may include forming the secondary cathode electrodes after forming the second organic function layer and before forming the cathode electrode.

The method may further include electrically connecting the cathode electrode and the auxiliary electrodes to one another through the secondary cathode electrodes by radiating a laser beam to the cathode electrode.

The auxiliary electrodes and the pixel electrodes may be formed on a same plane.

The organic emissive layers may be formed in a pattern of islands, and the auxiliary electrodes may be formed in a linear pattern between columns of the organic emissive layers.

The organic emissive layers may be formed in a linear pattern, and the auxiliary electrodes may be formed in a linear pattern between columns of the organic emissive layers.

The method may further include, after the forming of the pixel electrodes and the forming of the auxiliary electrodes and before the forming of the first organic function layer, forming a pixel definition layer including openings exposing the pixel electrodes and contact holes exposing the auxiliary electrodes.

The contact hole may be formed on the periphery of the organic emissive layer.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION OF THE INVENTION

Since the present invention may have various modifications and several embodiments, exemplary embodiments are shown in the drawings and will be described in detail. However, is the invention is not to be limited to the exemplary embodiments set forth herein but rather, the invention should be understood as including all modifications, equivalents, and substitutes.

Hereinafter, the exemplary embodiments of the present invention will be described in detail with reference to the attached drawings.

Figure 1:
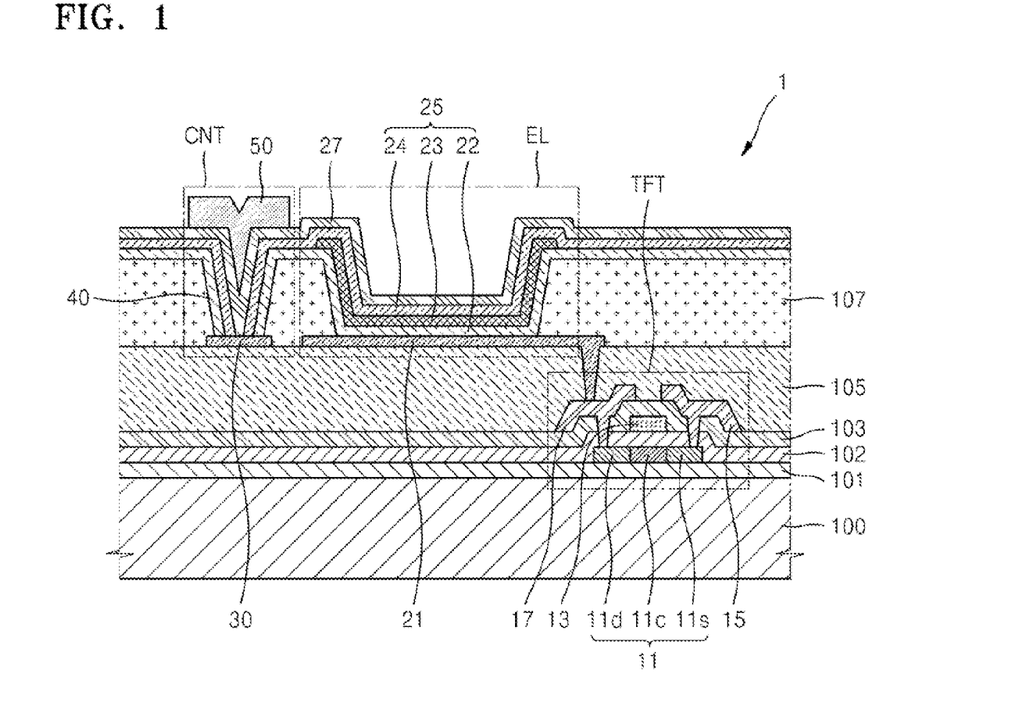
FIG. 1 is a schematic cross-sectional view illustrating an organic light emitting display apparatus according to an embodiment of the present invention.

FIG. 1 is a schematic cross-sectional view illustrating an organic light emitting display apparatus 1 according to an embodiment of the present invention. Referring to FIG. 1, the organic light emitting display apparatus includes a thin film transistor TFT as a driving device, an organic light emitting device EL, and a contact area CNT. Although only one thin film transistor TFT is shown in FIG. 1, this is only for convenience of description, the present invention is not limited thereto and a plurality of thin film transistors TFT and a plurality of capacitors may be included.

The thin film transistor TFT is formed of an active layer 11, a gate electrode 13, and source/drain electrodes 15 and 17, formed on a substrate 100. A first insulating layer 102, which is a gate insulating layer, is interposed between the gate electrode 13 and the active layer 11 to insulate these layers from each other. Also, source/drain areas $11s$ and $11d$ doped with high concentration impurities are formed on two opposing edges of the active layer 11, which are connected to the source/drain electrodes 15 and 17, respectively. An area between the source/drain areas $11s$ and $11d$ functions as a channel area $11c$. Between the source/drain electrodes 15 and 17 and the gate electrode 13, a second insulating layer 103 is interposed, which insulates the source/drain electrodes 15 and 17 from the gate electrode 13.

The organic light emitting device EL is formed of a pixel electrode 21 electrically connected to one of the source/drain electrodes 15 and 17 of the thin film transistor TFT on a third insulating layer 105 above the thin film transistor TFT. A cathode electrode 27 is formed facing the pixel electrode 21, and an intermediate layer 25 is interposed therebetween. A fourth insulating layer 107 is formed between the adjacent pixel electrodes 21 and covers an edge area of the pixel electrode 21. The intermediate layer 25 includes a first organic function layer 22, a second organic function layer 24, and an organic emissive layer 23. The first organic function layer 22 may include at least one hole transport layer HTL and at least one hole injection layer HIL. The second organic function layer 24 may include at least one electron transport layer ETL and at least one electron injection layer EIL.

In the contact area CNT, an auxiliary electrode 30 is in contact with the cathode electrode 27 through a contact hole 40 formed on the fourth insulating layer 107 and the cathode electrode 27 is in contact with a secondary cathode electrode 50 in the above. The secondary cathode electrode 50 may include a low-resistance metallic material.

FIGS. 2 to 9 are schematic cross-sectional views illustrating a process of manufacturing the organic light emitting display apparatus of FIG. 1. Hereinafter, the process of manufacturing the organic light emitting display apparatus will be schematically described.

Figure 2:
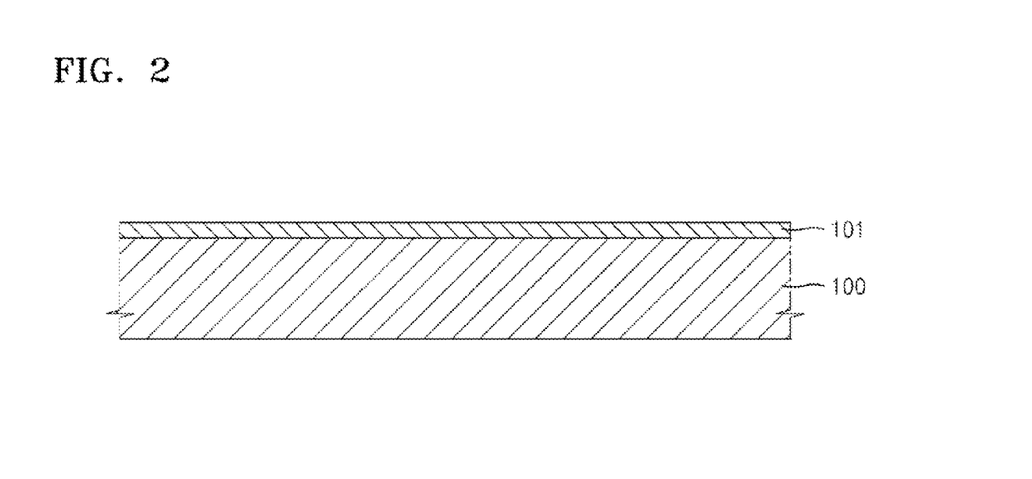
FIGS. 2 to 9 are schematic cross-sectional views illustrating a process of manufacturing the organic light emitting display apparatus of FIG. 1.

As shown in FIG. 2, an auxiliary layer 101 is formed on the substrate 100. The substrate 100 may be formed of glass that is a transparent material having $SiO_2$ as a main component. However, the substrate 100 is not limited thereto and may be formed of various materials, for example, transparent plastic or metal.

On a the substrate 100, the auxiliary layer 101, for example, a barrier layer, a blocking layer, and/or a buffer layer, may be provided to prevent dispersion of ions of impurities and water or air penetration and to planarize the surface. The auxiliary layer 101 may be formed of $SiO_2$ and/or $SiN_X$ by using various vapor-deposition methods, for example, a plasma enhanced chemical vapor deposition (PECVD) method, an atmospheric pressure CVD (APCVD) method, or a low pressure CVD (LPCVD) method.

Figure 3:
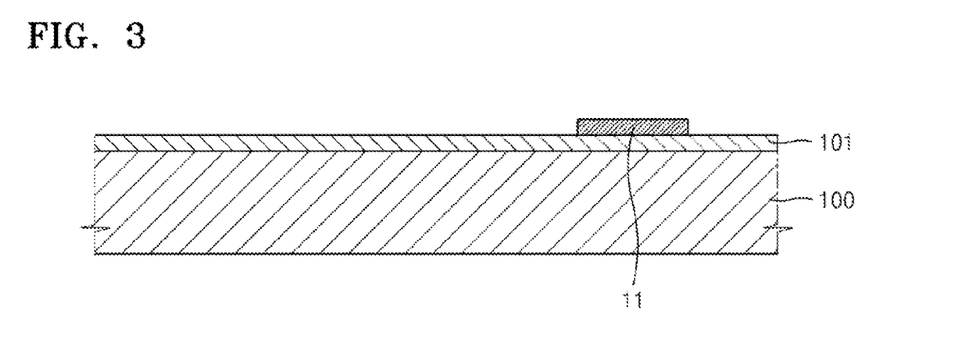

Next, as shown in FIG. 3, the active layer 11 of the thin film transistor TFT is formed on the auxiliary layer 101. The active layer 11 may be formed by patterning a polycrystalline silicon layer. The active layer 11 may include a semiconductor and may include ionic impurities formed by further doping. Also, the active layer 11 may be formed of an oxide semiconductor.

Figure 4:
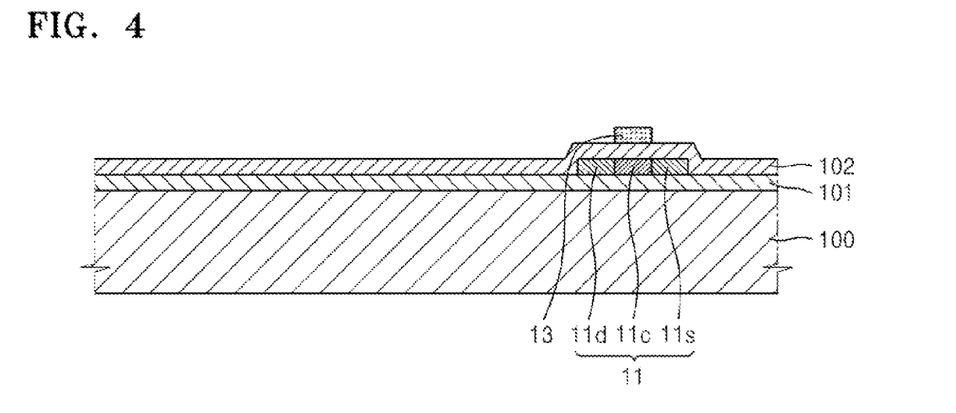

Next, as shown in FIG. 4, a first insulating layer 102 and the gate electrode 13 of the thin film transistor TFT are formed on the substrate 100 on which the active layer 11 is formed.

The first insulating layer 102 may be formed by depositing an inorganic insulating film, for example, $SiN_X$ or $SiO_X$ on an entire substrate 100 by using one of the PECVD method, the APCVD method, and LPCVD method. The first insulating layer 102 is interposed between the active layer 11 and the gate electrode 13 of the thin film transistor TFT and functions as a gate insulating layer of the thin film transistor TFT.

The gate electrode 13 may be formed by forming a first conductive layer (not shown) on the entire substrate 100 on which the first insulating layer 102 is formed and patterning the same. The first conductive layer may be formed of various conductive materials. For example, the first conductive layer may be formed to have a single layer or a multilayer structure including, for example, M, Ag, Mg, Al, Pt, Pd, Au, Ni, Nd, Ir, Cr, Li, Ca, Mo, Ti, W, MoW, or Cu.

In this case, the gate electrode 13 is formed to correspond to the center of the active layer 11, and the source/drain areas 11s and 11d and the channel area 11c disposed therebetween are formed in the active layer 11. The source/drain areas 11s and 11d correspond to both sides of the gate electrode 13 and are formed by doping n-type or p-type impurities to the active layer 11 by using the gate electrode 13 as a self align mask. In this case, the impurities may be boron B ions or phosphorus ions.

Figure 5:
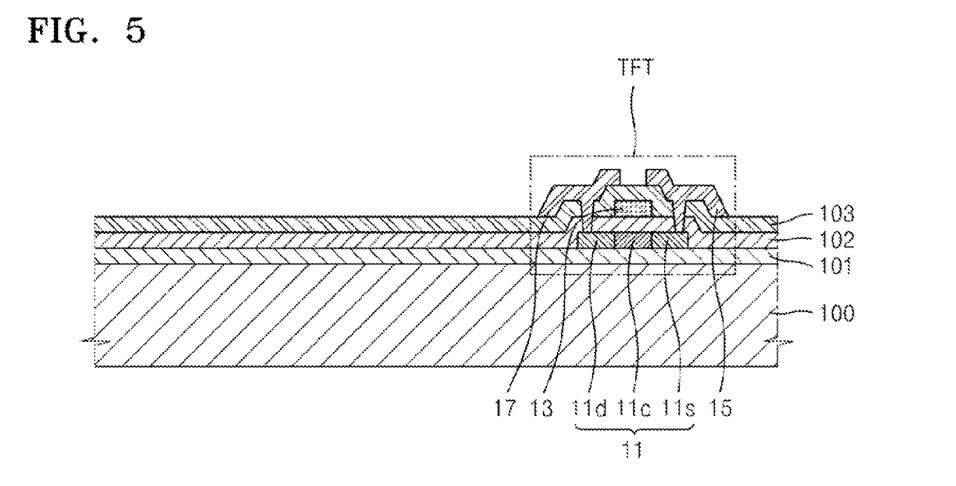

Next, as shown in FIG. 5, a second insulating layer 103 and the source/drain electrodes 15 and 17 of the thin film transistor TFT are formed on the substrate 100 on which the gate electrode 13 is formed.

The second insulating layer 103 may be formed, of the same inorganic insulating material as that of the first insulating layer 102 described above, on the entire substrate 100. The second insulating layer 103 may function as an interlayer insulating layer between the gate electrode 13 and the source/drain electrodes 15 and 17 of the thin film transistor TFT. The second insulating layer 103 may be formed of not only the inorganic insulating material but also of at least one organic insulating material, for example, polyimide, polyamide, acrylic resin, benzocyclobutene, or phenol resin and may be formed by alternately depositing an organic insulating material and an inorganic insulating material. In the second insulating layer 103, contact holes exposing parts of the source/drain areas 11s and 11d, respectively, are formed.

The source/drain electrodes 15 and 17 may be formed by forming a second conductive layer (not shown) on the entire substrate 100 on which the second insulating layer 103 is formed and patterning the same. The second conductive layer may be selected from the same conductive materials as those of the first conductive layer described above but is not limited thereto and may be formed of various other conductive materials. The source/drain electrodes 15 and 17 are electrically connected to the source/drain areas 11s and 11d of the active layer 11 through the contact holes of the second insulating layer 103.

Figure 6:
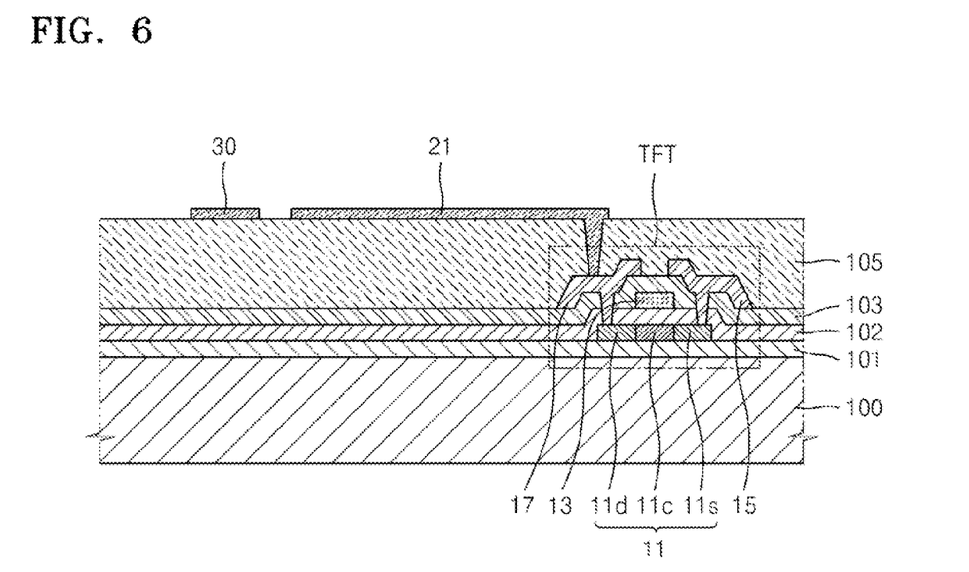

Next, as shown in FIG. 6, the third insulating layer 105, the pixel electrode 21, and the auxiliary electrode 30 are formed on the substrate 100.

The third insulating layer 105 may be formed by spin-coating using an organic insulating material, for example, polyimide, polyamide, acrylic resin, benzocyclobutene, or phenol resin. The third insulating layer 105 not only may be formed of an organic insulating material but also may be formed of an inorganic insulating material, for example, $SiO_2$, $SiN_x$, $Al_2O_3$, $CuO_x$, $Tb_4O_7$, $Y_2O_3$, $Nb_2O_5$, or $Pr_2O_3$. Also, the third insulating layer 105 may be formed having a multilayer structure in which an organic insulating material and an inorganic insulating material are alternately deposited. The third insulating layer 105 functions as a planarization film for protecting and planarizing the thin film transistor TFT disposed below.

On the third insulating layer 105, the pixel electrode 21 and the auxiliary electrode 30 are formed.

The pixel electrode 21 and the auxiliary electrode 30 may be formed by forming a third conductive layer (not shown) on the entire substrate 100 on which the third insulating layer 105 is formed and patterning the same, respectively. The third conductive layer may have a double layer structure formed of a lower layer formed of, for example, Ag, Mg, Al, Pt, Pd, Au, Ni, Nd, Ir, Cr, Li, Ca, or a compound thereof which is a metallic material having excellent reflection efficiency, and an upper layer formed of ITO, IZO, ZnO, IGO or $In_2O_3$, which is a transparent conductive material having a relatively higher work function. Accordingly, the pixel electrode 21 and the auxiliary electrode 30 are formed of the same material on the same plane.

The pixel electrode 21 is electrically connected to one of the source/drain electrodes 15 and 17 through the contact holes. The auxiliary electrode 30 may be formed on the periphery of the pixel electrode 21 to prevent voltage drops of the cathode electrode 27 that will be formed after.

Figure 7:
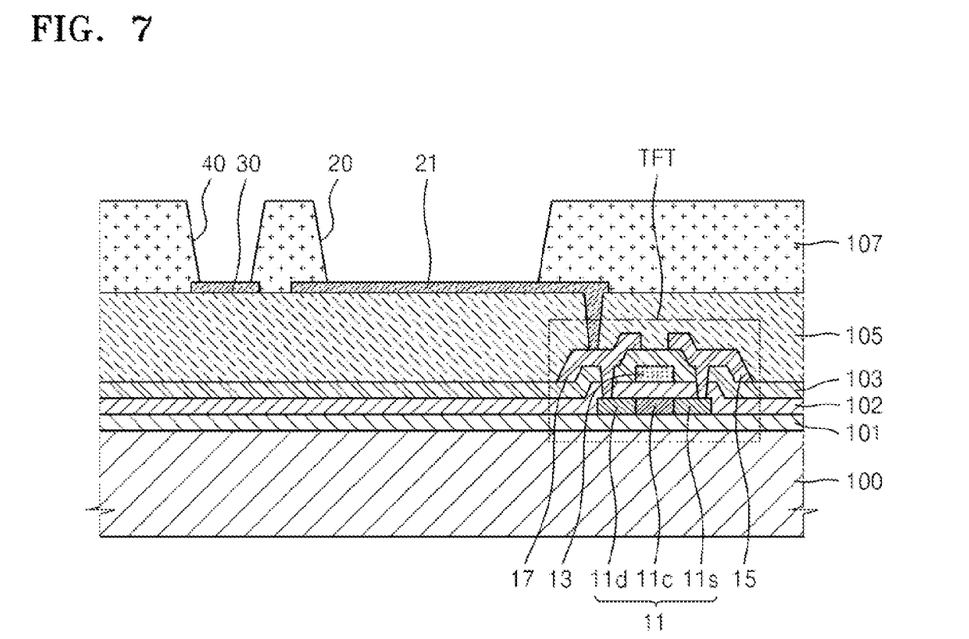

Next, as shown in FIG. 7, the fourth insulating layer 107 is formed and an opening 20 exposing a part of the pixel electrode 21 and a contact hole 40 exposing a part of the auxiliary electrode 30 are formed by patterning the fourth insulating layer 107.

The fourth insulating layer 107 functions as a pixel definition layer (PDL). The fourth insulating layer 107 may be formed by spin-coating using at least one organic insulation material, for example, polyimide, polyamide, acrylic resin, benzocyclobutene, or phenol resin. The fourth insulating layer 107 not only may be formed of an organic insulating material but also may be formed of one inorganic insulating material, for example, $SiO_2$, $SiN_x$, $Al_2O_3$, $CuO_x$, $Tb_4O_7$, $Y_2O_3$, $Nb_2O_5$, or $Pr_2O_3$. Also, the fourth insulating layer 107 may be formed having a multilayer structure in which an organic insulating material and an inorganic insulating material are alternately deposited.

Figure 8:
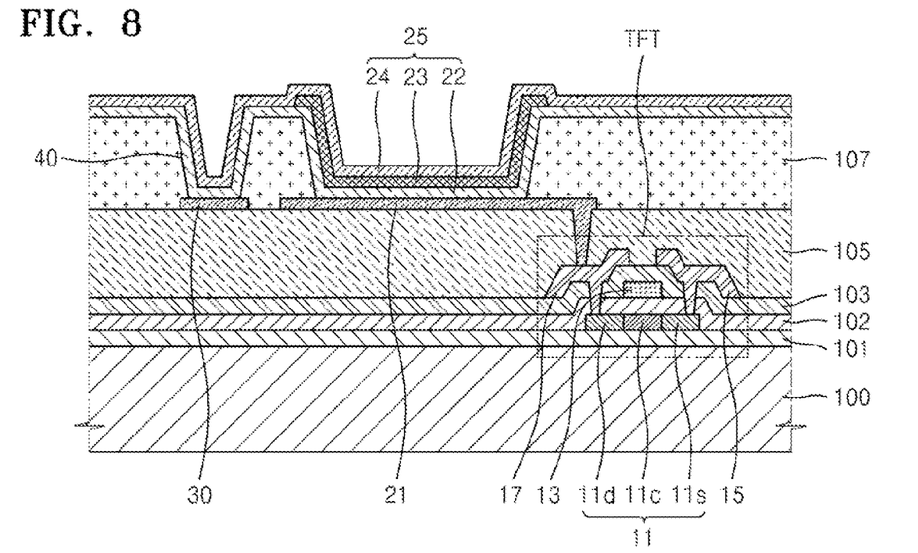

Next, as shown in FIG. 8, the intermediate layer 25 is formed on the opening 20 exposing the part of the pixel electrode 21.

The intermediate layer 25 includes the first organic function layer 22, the organic emissive layer 23, and the second organic function layer 24.

The first organic function layer 22 may include at least one hole injection layer and at least one hole transport layer and is a common layer formed on the entire substrate 100. The hole injection layer may be formed to a certain thickness to easily inject holes. This thickness may vary depending upon the materials used for the other layers. On the hole injection layer, the hole transport layer having high hole transportability to easily transport holes may be formed. Conditions of depositing and coating the hole transport layer are different according to compounds of the hole transport layer but may be selected from among the same range of conditions for forming the hole injection layer. The organic emissive layer 23 is a pattern layer formed on the pixel electrode 21 in a sub-pixel SPX area. The organic emissive layer 23 may be provided as a low molecular or a high molecular organic material. When the organic emissive layer 23 emits red, green, and blue light, respectively, the organic emissive layer 23 may be patterned into a red emissive layer, a green emissive layer, and a blue emissive layer, respectively. When the organic emissive layer 23 emits white light, the organic emissive layer 23, to emit the white light, may have a multilayer structure in which the red emissive layer, the green emissive layer, and the blue emissive layer are deposited. Alternatively, the organic emissive layer 23 may have a single layer structure including a red emissive material, a green emissive material, and a blue emissive material. The second organic function layer 24 may include at least one electron injection layer and at least one electron transport layer. The second organic function layer 24 is a common layer formed on the entire substrate 100. The electron transport layer above the organic emissive layer 23 provides for efficient transport of electrons. Above the electron transport layer, the electron injection layer is formed of a material that allows electrons to be easily injected from the cathode electrode 27.

The first organic function layer 22 and the second organic function layer 24 are also formed on an exposed top of the auxiliary electrode 30 through the contact hole 40.

Figure 9:
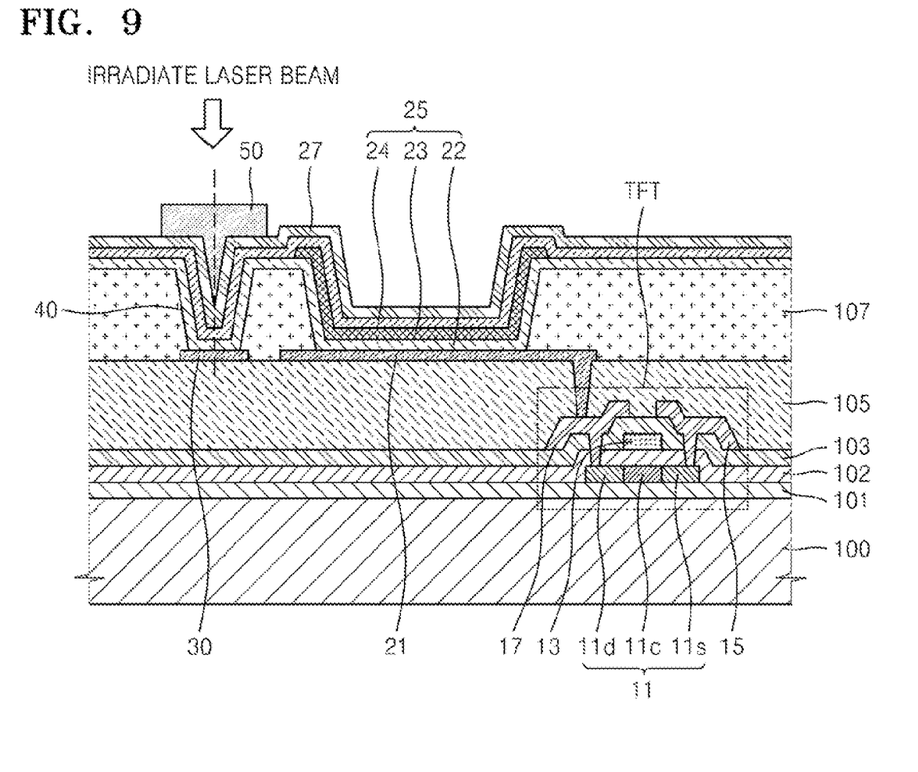

Next, as shown in FIG. 9, the cathode electrode 27 and the secondary electrode 50 are formed on the substrate on which the intermediate layer 25 is formed.

The cathode electrode 27 is deposited on the entire substrate 100 and is formed as a common electrode that faces the pixel electrode 21. In an area on a top of the cathode electrode 27, corresponding to the contact hole 40, the secondary cathode electrode 50 is formed such that the cathode electrode 27 and the secondary cathode electrode 50 are in contact with each other in a contact area CNT. The cathode electrode 27 is formed of a thin transparent conductive material for top emission. Also, the cathode electrode 27 may have a double layer structure formed by forming a semitransparent metallic film including a metal having a small work function, for example, Ag, Mg, Al, Pt, Pd, Au, Nd, Ir, Cr, Li, Ca, or a compound thereof and then forming a transparent conductive film including ITO, IZO, ZnO, or $In_2O_3$ on the semitransparent metallic film.

The secondary cathode electrode 50 may be formed of the metal having the small work function used for the cathode electrode 27, for example, Ag, Mg, Al, Pt, Pd, Au, Ni, Nd, Ir, Cr, Li, Ca or the compound thereof, and more particularly, may be formed of Al, AlNd, Cu, or a copper alloy having low resistance properties and having a thickness greater than that of the cathode electrode 27. Since the cathode electrode 27 is formed to be thin, the cathode electrode 27 may not fill the entire contact hole 40, thereby generating a defect of contact with the auxiliary electrode 30. Accordingly, the secondary cathode electrode 50 formed of a low resistance material is formed to be thick and as an island on the top of the cathode electrode 27.

In the contact area CNT, the first organic function layer 22 and the second organic function layer 24 are formed on the top of the auxiliary electrode 30. Accordingly, for contact between the auxiliary electrode 30 and the cathode electrode 27, the first organic function layer 22 and the second organic function layer 24 are removed.

To remove the first organic function layer 22 and the second organic function layer 24, a laser beam is radiated to the secondary cathode electrode 50 to perform laser welding. Accordingly, the first organic function layer 22 and the secondary function layer 24 formed on the contact hole 40 are demolished and, as shown in FIG. 1, the cathode electrode 27 and the secondary cathode electrode 50 fill the contact hole 40 and are electrically connected to the auxiliary electrode 30. According to an exemplary embodiment, the cathode electrode 27 and the auxiliary electrode 30 are brought into contact with each other by using a laser beam to complete a cathode contact such that it is not necessary to use an additional mask to remove the first organic function layer 22 and the second organic function layer 24 before forming the cathode electrode 27. The organic materials do not remain on the auxiliary electrode 30.

According to an exemplary embodiment, although it has been described that the laser beam is radiated to the secondary cathode electrode 50, a capping layer CPL (not shown) including an organic insulating material or an inorganic layer including an inorganic insulating material for enhancing optical properties and protecting the cathode electrode 27 may be further formed on the secondary cathode electrode 50 and then the laser beam is radiated, thereby completing the cathode contact.

Figure 10:
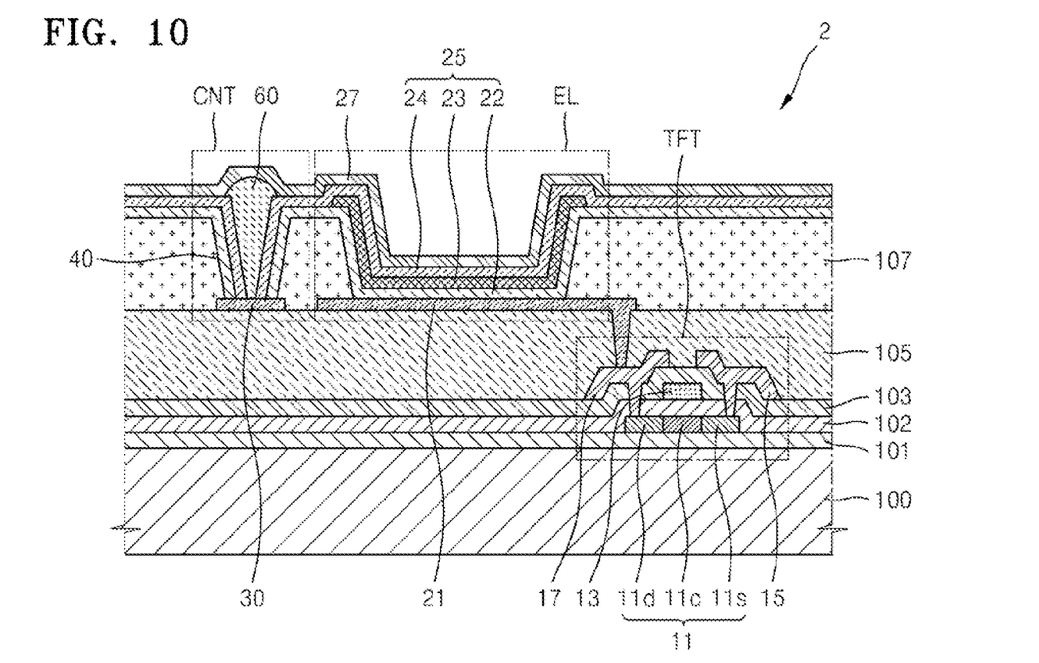
FIG. 10 is a schematic cross-sectional view illustrating an organic light emitting display apparatus according to an exemplary embodiment of the present invention.

FIG. 10 is a schematic cross-sectional view illustrating an organic light emitting display apparatus 2 according to an exemplary embodiment of the present invention.

Referring to FIG. 10, the organic light emitting display apparatus 2 includes a thin film transistor TFT as a driving device, an organic light emitting device EL, and a contact area CNT. Although only one thin film transistor TFT is shown in FIG. 10, this is only for convenience of description, the present invention is not limited thereto and a plurality of thin film transistors TFT and a plurality of capacitors may be included. Comparing with the organic light emitting display apparatus 1 of FIG. 1, the organic light emitting display apparatus 2 of FIG. 10 has a different contact area CNT structure but other parts thereof are the same as those of the organic light emitting display apparatus 1. Accordingly, a detailed description of the same structure will be omitted and differences thereof will be described. While describing the organic light emitting display apparatus 2, like reference numerals may designate like elements.

In the contact area CNT, an auxiliary electrode 30 is in contact with a secondary cathode electrode 60 and a cathode electrode 27 formed on the secondary cathode electrode 60 through a contact hole 40 formed in a fourth insulating layer 107. The secondary cathode electrode 60 may include a low-resistance metallic material.

Figure 11:
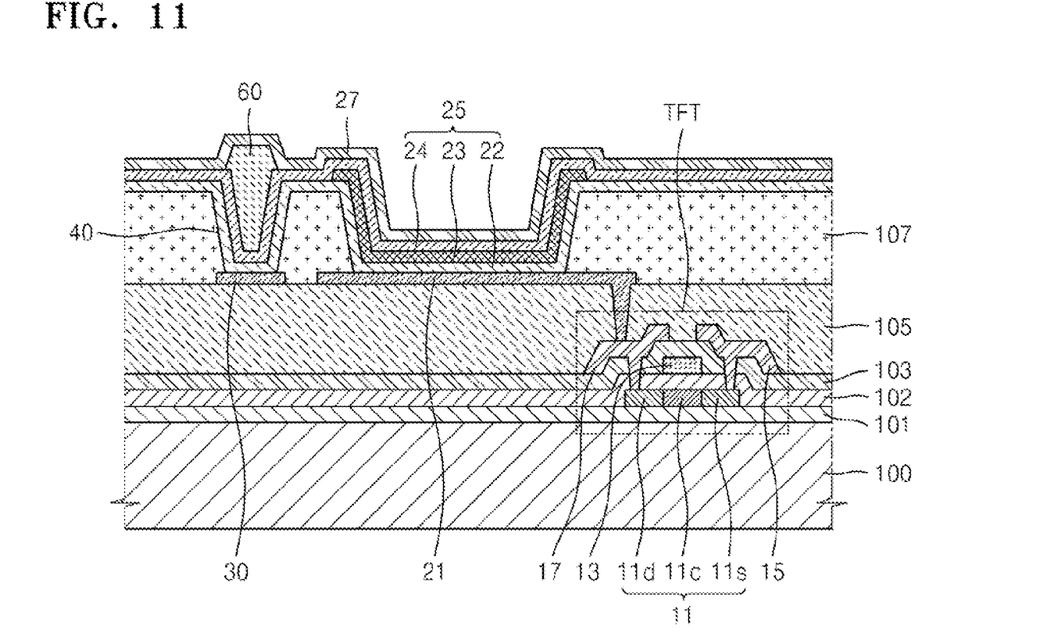
FIGS. 11 and 12 are schematic cross-sectional views partially illustrating a method of manufacturing the organic light emitting display apparatus of FIG. 10.
Figure 12:
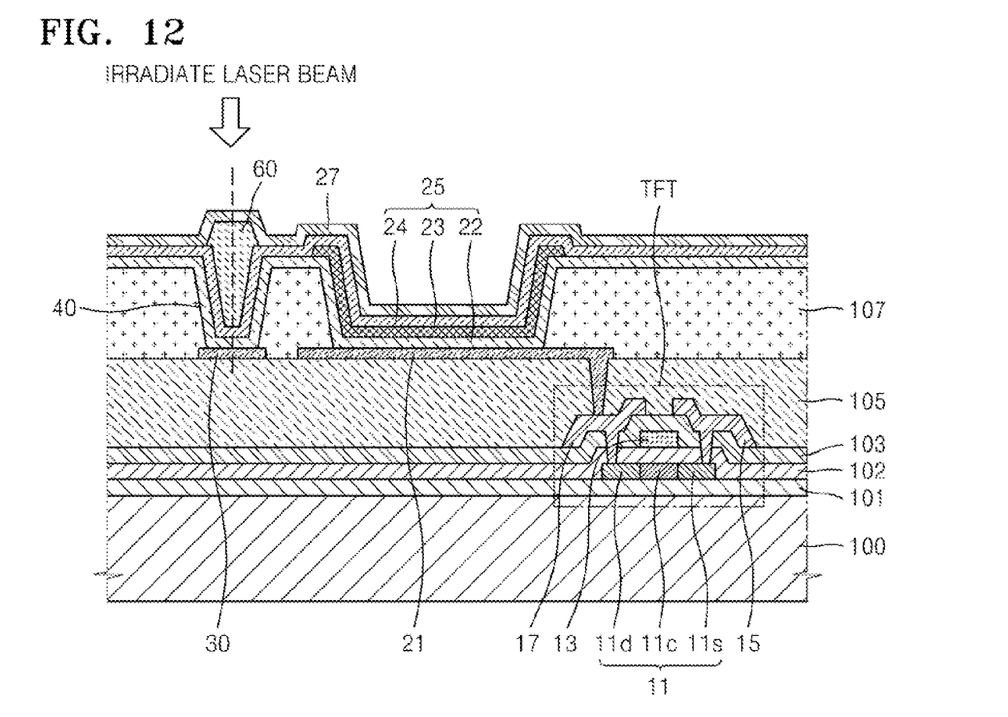

FIGS. 11 to 12 are schematic cross-sectional views partially illustrating a method of manufacturing the organic light emitting display apparatus 2 of FIG. 10.

As shown in FIGS. 2 to 7, the thin film transistor TFT is formed on a substrate 100 and a pixel electrode 21 and the auxiliary electrode 30 are formed on a third insulating layer 105. Also, a fourth insulating layer 107 is formed on the pixel electrode 21 and the auxiliary electrode 30 and patterned, thereby forming an opening 20 exposing a part of the pixel electrode 21 and a contact hole 40 exposing a part of the auxiliary electrode 30.

Next, as shown in FIG. 8, an intermediate layer 25 is formed on the opening 20 exposing the part of the pixel electrode 21. The intermediate layer 25 includes a first organic function layer 22, an organic emissive layer 23, and a second organic function layer 24. In this case, the first organic function layer 22 and the second organic function layer 24 are also formed on an exposed top of the auxiliary electrode 30 through the contact hole 40.

Next, as shown in FIG. 11, the second cathode electrode 60 and the cathode electrode 27 are formed on the substrate on which the intermediate layer 25 is formed.

The secondary cathode electrode 60 may be formed of the metal having the small work function used for the cathode electrode 27, for example, Ag, Mg, Al, Pt, Pd, Au, Ni, Nd, Ir, Cr, Li, Ca or a compound thereof, and more particularly, may be formed of Al, AlNd, Cu, or a copper alloy having low resistance properties to have a thickness greater than that of the cathode electrode 27. Since the cathode electrode 27 is formed to be thin, the cathode electrode 27 may not fill the entire contact hole 40, thereby generating a defect of contact with the auxiliary electrode 30. Accordingly, in accordance with exemplary embodiments of the present invention, the secondary cathode electrode 60 formed of the low resistance material is formed as a particle or an island shape pattern before forming the cathode electrode 27.

The cathode electrode 27 is deposited on the entire substrate 100 to be formed as a common electrode and faces the pixel electrode 21. The cathode electrode 27 is in contact with the secondary cathode electrode 60 in a lower part in the contact area CNT. The cathode electrode 27 is formed of a thin transparent conductive material for top emission. Also, the cathode electrode 27 may have a double layer structure by forming a semitransparent metallic film including a metal having a small work function, for example, Ag, Mg, Al, Pt, Pd, Au, Ni, Nd, Ir, Cr, Li, Ca, or a compound thereof and then forming a transparent conductive film including ITO, IZO, ZnO, of $In_2O_3$ on the semitransparent metallic film.

Sequentially, as shown in FIG. 12, a laser beam is radiated to the cathode electrode 27 in the contact area CNT, thereby performing laser welding. According thereto, the first organic function layer 22 and the secondary function layer 24 formed on the contact hole 40 are demolished and, as shown in FIG. 10, the secondary cathode electrode 60 and the cathode electrode 27 fill the contact hole 40 and are electrically connected to the auxiliary electrode 30. According to an exemplary embodiment of the present invention, the cathode electrode 27 and the auxiliary electrode 30 are brought into contact with each other by using the laser beam to complete a cathode contact such that it is not necessary to use an additional mask to remove the first organic function layer 22 and the second organic function layer 24 before forming the cathode electrode 27. The organic materials do not remain on the auxiliary electrode 30.

According to an exemplary embodiment, although it has been described that the laser beam is radiated to the cathode electrode 27, a capping layer CPL (not shown) including an organic insulating material or an inorganic film including an inorganic insulating material for enhancing optical properties and protecting the cathode electrode 27 are further formed on the cathode electrode 27 and then the laser beam is radiated, thereby completing the cathode contact.

Figure 13:
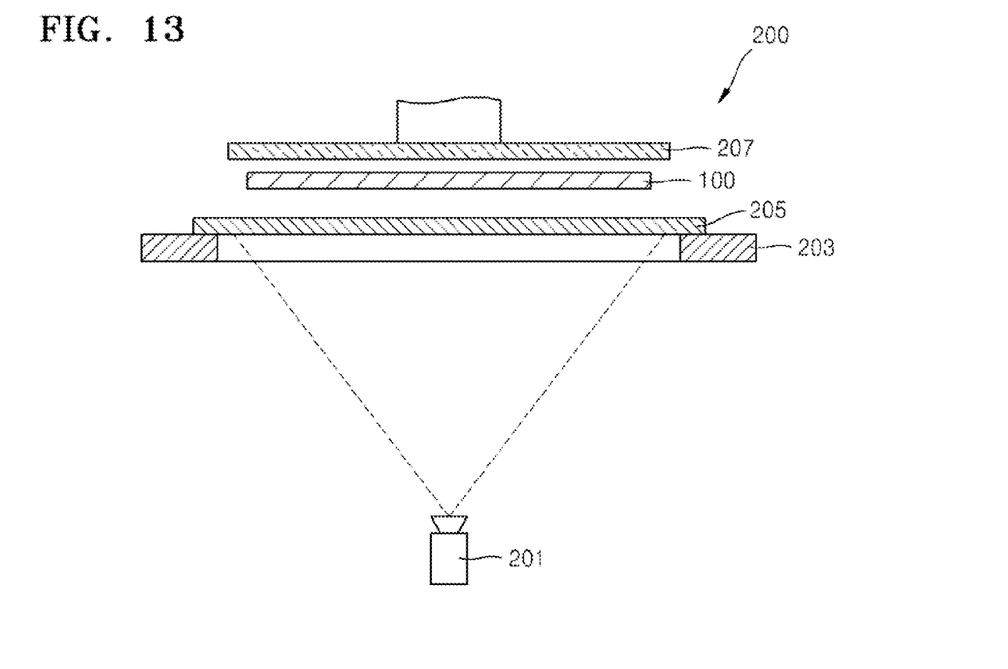
FIG. 13 is a schematic view illustrating a vapor-deposition apparatus 200 for forming an intermediate layer according to an exemplary embodiment of the present invention.

FIG. 13 is a schematic view illustrating a deposition apparatus 200 for forming the intermediate layer 25 according to an embodiment of the present invention.

Referring to FIG. 13, the intermediate layer 25 may be formed by independent deposition by using the deposition apparatus 200. A deposition process is performed in a high-degree vacuum chamber (not shown), and a deposition material generated by a deposition source 201 passes through a deposition mask 205 mounted on a mask frame 203 and is deposited on the substrate 100. The substrate 100 is maintained in a certain location by a substrate maintenance unit 207 and the substrate 100 is aligned with the deposition mask 205 to be closely attached thereto, thereby allowing for deposition of the deposition material onto the substrate 100. While depositing the first organic function layer 22 and the second organic function layer 24, an open mask corresponding to the entire substrate 100 is used as the deposition mask 205. While depositing the organic emissive layer 23, a fine metal mask having a slit pattern formed corresponding to each pixel electrode 21 is used as the deposition mask 205.

Figure 14:
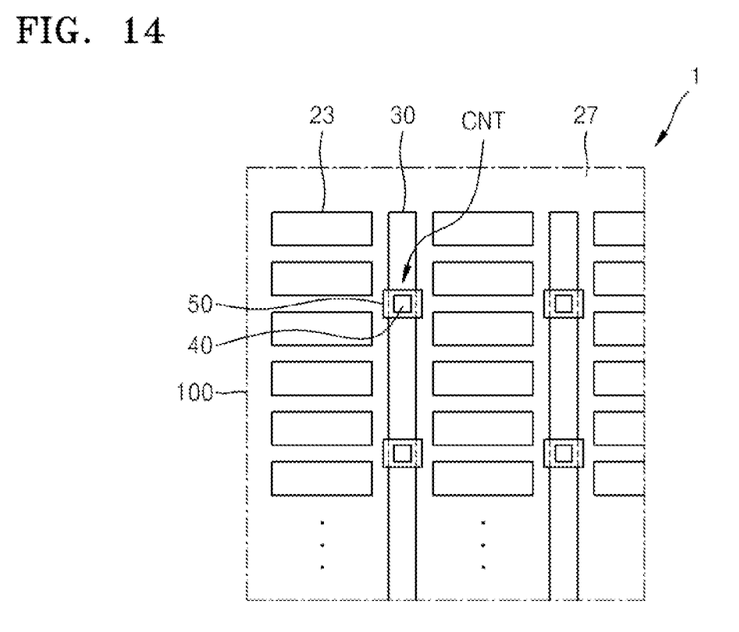
FIGS. 14 and 15 are top views schematically illustrating a part of an organic light emitting display apparatus formed by using the vapor-deposition apparatus of FIG. 13.

FIG. 14 is a top view schematically illustrating a part of the organic light emitting display apparatus 1 formed by using the deposition apparatus 200 of FIG. 13.

Referring to FIG. 14, the first organic function layer 22 (refer to FIG. 1) is formed on the entire substrate 100 above the pixel electrode 21 (refer to FIG. 1) by using an open mask, the organic emissive layer 23 is formed on the first organic function layer 22 as an island above the pixel electrode 21 by using the fine metal mask, and the second organic function layer 24 (refer to FIG. 1) is formed on the entire substrate 100 above the organic emissive layer 23 by using the same open mask.

Between columns of the organic emissive layers 23, the auxiliary electrodes 30 having a linear pattern are formed together with the pixel electrode 21 at the same time in locations separated from the organic emissive layer 23. Above the auxiliary electrode 30, the cathode electrode 27 is formed on the substrate 100 as a top electrode. In the contact area CNT in which the auxiliary electrode 30 and the cathode electrode 27 are in contact with each other, the secondary cathode electrode 50 having a size larger than that of the contact hole 40 is formed. The contact area CNT may be formed as a plurality thereof with certain intervals FIG. 15 is a top view schematically illustrating a part of the organic light emitting display apparatus 2 formed by using the deposition apparatus 200 of FIG. 13.

Figure 15:
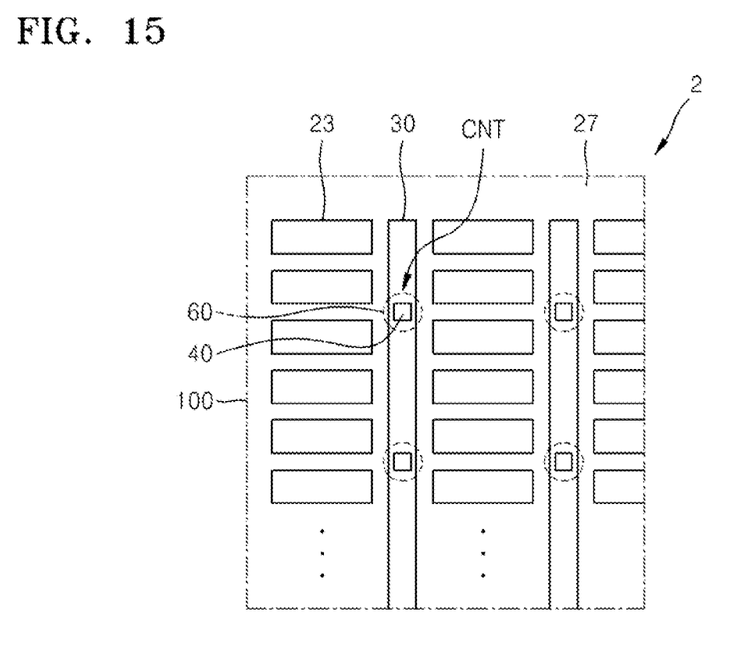

Referring to FIG. 15, the first organic function layer 22 (refer to FIG. 10) is formed on the entire substrate 100 above the pixel electrode 21 (refer to FIG. 10) by using an open mask, the organic emissive layer 23 is formed on the first organic function layer 22 as an island above the pixel electrode 21 by using the fine metal mask, and the second organic function layer 24 (refer to FIG. 10) is formed on the entire substrate 100 above the organic emissive layer 23 by using the same open mask.

Between columns of the organic emissive layers 23, the auxiliary electrodes 30 formed in a linear pattern are formed together with the pixel electrode 21 at the same time in locations separated from the organic emissive layer 23. The secondary cathode electrode 60 is formed in the contact area CNT above the auxiliary electrode 30 while covering the contact hole 40. Above the auxiliary electrode 30, the cathode electrode 27 is formed on the substrate 100 as a top electrode. The contact areas CNT in which the auxiliary electrode 30 and the cathode electrode 27 are in contact with each other may be formed at regular intervals.

Figure 16:
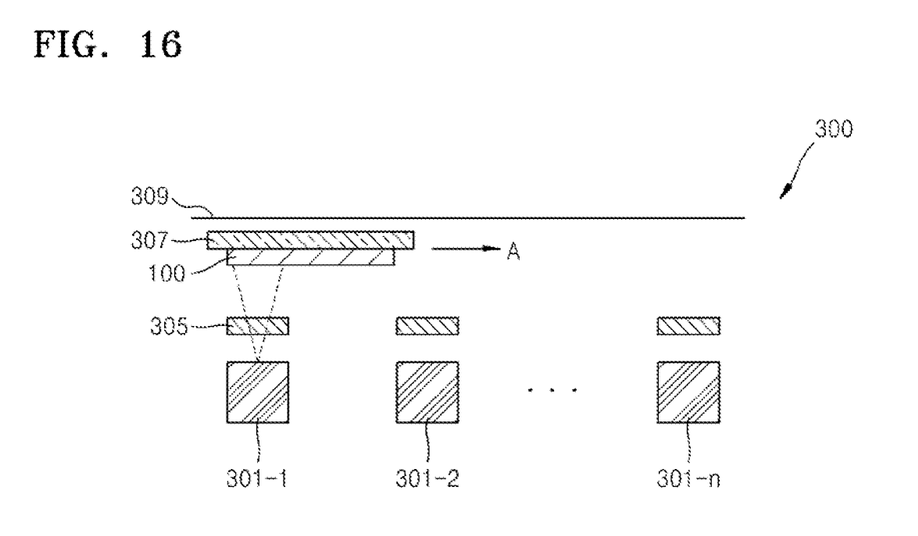
FIG. 16 is a schematic view illustrating a vapor-deposition apparatus for forming an intermediate layer according to an exemplary embodiment of the present invention.

FIG. 16 is a schematic view illustrating a deposition device 300 for forming the intermediate layer 25 according to an exemplary embodiment of the present invention.

Referring to FIG. 16, the intermediate layer 25 may be formed by using the deposition apparatus 300. A deposition process is performed in a high-degree vacuum chamber (not shown), and a plurality of deposition sources 301-1, 301-2, ..., and 301-n are arranged in the deposition chamber of the deposition apparatus 300. Deposition materials discharged from the plurality of deposition sources 301-1, 301-2, ..., and 301-n pass through respective deposition masks 305 and are deposited on the substrate 100. The number of deposition sources may vary based on the number of deposition materials and deposition conditions. While the substrate 100 and the plurality of deposition sources 301-1, 301-2, ..., and 301-n are spaced apart at regular intervals, the substrate 100 is fastened to a substrate maintenance unit 307 and is sequentially transferred in a certain direction (direction A) by a transfer unit 309 so that deposition may be performed by using a scanning method. For example, the plurality of deposition sources 301-1, 301-2, ..., and 301-n and the substrate 100 are moved relative to one another and the deposition is sequentially performed. The substrate may be kept stationary while the plurality of deposition sources 301-1, 301-2, ..., and 301-n are transferred in the direction A to perform the deposition. The respective deposition sources for depositing the first organic function layer 22 an the second organic function layer 24 use open masks as the deposition masks 305, and the deposition source for depositing the organic emissive layer 23 uses a slit sheet on which a plurality of patterned slits are formed, as the deposition mask 305.

Figure 17:
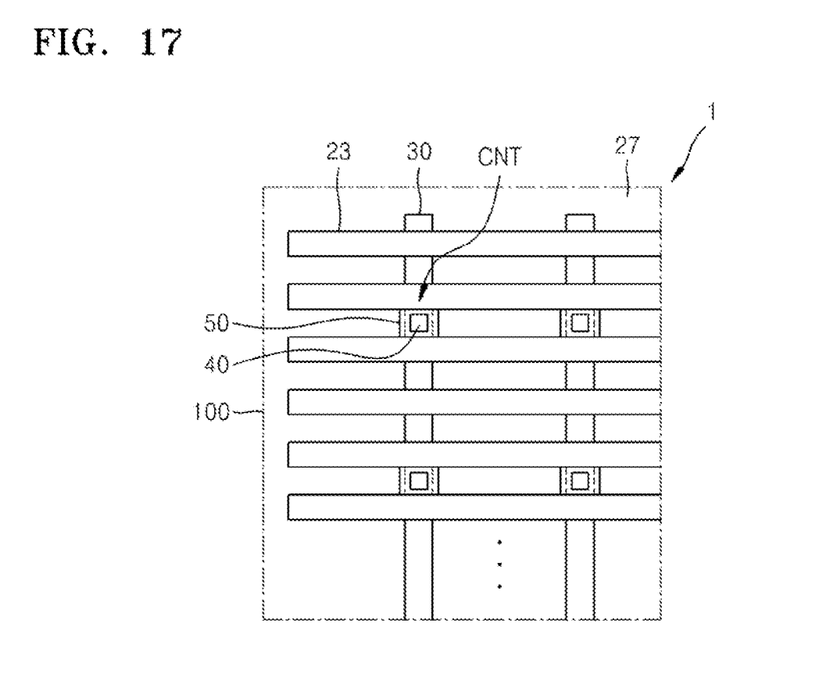
FIGS. 17 and 18 are top views schematically illustrating a part of an organic light emitting display apparatus formed by using the vapor-deposition apparatus of FIG. 16.

FIG. 17 is a top view schematically illustrating a part of the organic light emitting display apparatus 1 formed by using the deposition apparatus 300 of FIG. 16.

Referring to FIG. 17, the first organic function layer 22 (referring to FIG. 1) is formed on the entire substrate 100 above the pixel electrode 21 (referring to FIG. 1) by using an open mask, the organic emissive layer 23 is formed on the first organic function layer 22 above the pixel electrode 21 by using the slit sheet, and the second organic function layer 24 (referring to FIG. 1) is formed on the entire substrate 100 above the organic emissive layer 23 by using the same open mask. Since the plurality of deposition sources 301-1, 301-2, ..., and 301-n and the substrate 100 are transferred toward one another and the deposition is performed by using the scanning method of the deposition apparatus 300 of FIG. 16, the organic emissive layers 23 are sequentially formed to have a linear shape.

In a direction of traversing the organic emissive layers 23 in a linear pattern, the auxiliary electrode 30 is formed in a linear pattern together with the pixel electrode 21 at substantially the same time. Above the auxiliary electrode 30, the cathode electrode 27 is formed on the entire substrate 100 as a top electrode. In the contact area CNT in which the auxiliary electrode 30 and the cathode electrode 27 are in contact with each other, the secondary cathode electrode 50 having a size larger than that of the contact hole 40 is formed. The contact area CNT may be formed as a plurality thereof with certain intervals.

Figure 18:
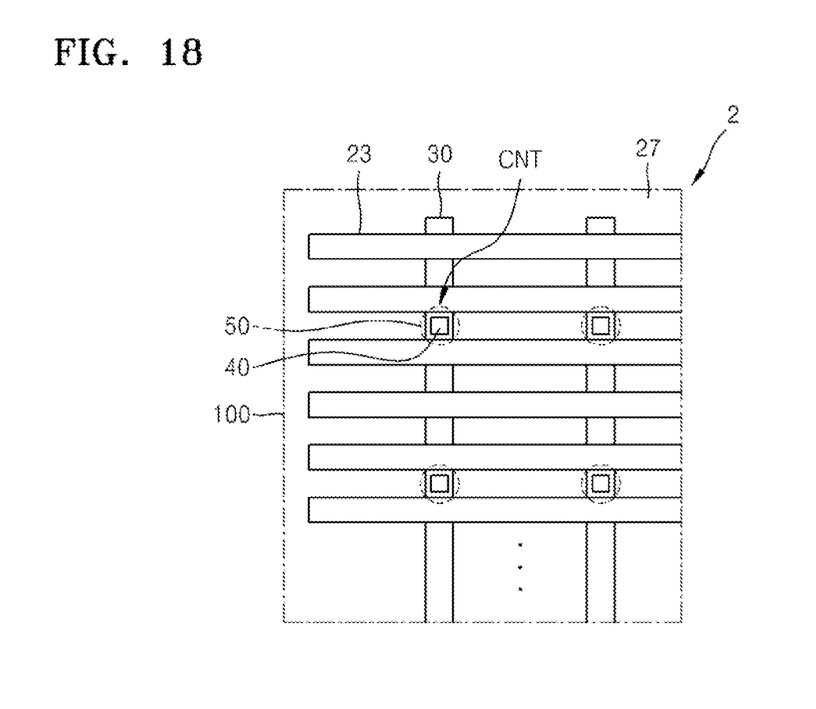

FIG. 18 is a top view schematically illustrating a part of the organic light emitting display apparatus 2 formed by using the deposition apparatus 300 of FIG. 16.

Referring to FIG. 18, the first organic function layer 22 (referring to FIG. 10) is formed on the entire substrate 100 above the pixel electrode 21 (referring to FIG. 10) by using an open mask, the organic emissive layer 23 is formed on the first organic function layer 22 above the pixel electrode 21 by using the slit sheet, and the second organic function layer 24 (referring to FIG. 10) is formed on the entire substrate 100 above the organic emissive layer 23 by using the same open mask. Since the plurality of deposition sources 301-1, 301-2, ..., and 301-n and the substrate 100 are moved relative to one another and the deposition is performed by using the scanning method of the deposition apparatus 300 of FIG. 16, the organic emissive layers 23 are sequentially formed to have a linear shape.

In a direction of traversing the organic emissive layers 23 in a linear pattern, the auxiliary electrode 30 is formed in a linear pattern together with the pixel electrode 21 at substantially the same time. The secondary cathode electrode 60 is formed in the contact area CNT above the auxiliary electrode 30 while covering the contact hole 40. Next, above the auxiliary electrode 30, the cathode electrode 27 is formed on the substrate 100 as a top electrode. The contact areas CNT, in which the auxiliary electrode 30 and the cathode electrode 27 are in contact with each other, may be formed at regular intervals.

When using the deposition apparatus 300 of FIG. 16, the organic emissive layer 23 is formed in the linear pattern and a shadow is formed such that the first organic function layer and the second organic function layer, and also the organic emissive layer may be formed on the contact hole 40 in the auxiliary electrode 30. According to exemplary embodiments, the cathode electrode 27 and the secondary cathode electrodes 50 and 60 are formed to be thick and have low resistances, and then, organic layers are removed by radiating a laser beam and contact between the auxiliary electrode 30 and the cathode electrode 27 is completed. Accordingly, since the organic layers formed on the contact hole 40 are removed without the use of an additional mask, the number of patterning processes may be reduced and the auxiliary electrode 30 and the cathode electrode 27 may be brought into contact with each other. Also, residuals of organic layers on the contact hole 40 may be avoided. Accordingly, a defect of the contact between the auxiliary electrode 30 and the cathode electrode 27 may be prevented, thereby reducing voltage drops of the cathode electrode 27.

In the exemplary embodiments, to prevent deterioration of electrical properties of a display apparatus, an auxiliary electrode is used and a path that allows for the auxiliary electrode to be electrically connected to a cathode electrode through a contact hole is formed by using a secondary cathode electrode. When an organic insulating layer is formed on a previously formed contact hole, a problem may occur in contact between an auxiliary electrode and a cathode electrode. Accordingly, in the exemplary embodiments, a secondary cathode electrode is formed additionally as a particle or a pattern on a top or a bottom of a cathode electrode on the organic insulating layer and an artificial short or melting is performed by using laser heat treatment, thereby forming an electrical path between the auxiliary electrode and the cathode electrode through a contact hole, without patterning the organic insulating layer.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. An organic light emitting display apparatus comprising:
    a plurality of pixel electrodes corresponding to a plurality of pixels, the plurality of pixel electrodes formed on a substrate;
    a plurality of auxiliary electrodes, wherein each of the plurality of auxiliary electrode is formed on at least a part of a periphery of each of the plurality of pixel electrodes;
    a first organic function layer formed on the substrate, the first organic function layer covering the plurality of pixel electrodes and the plurality of auxiliary electrodes;
    a plurality of organic emissive layers corresponding to the plurality of pixels, the plurality of organic emissive layers formed on the first organic function layer;
    a second organic function layer formed on the substrate and covering the plurality of organic emissive layers;
    a cathode electrode formed on the substrate such that the cathode electrode faces the plurality of pixel electrodes and covers the second organic function layer; and
    a plurality of secondary cathode electrodes, wherein each of the plurality of secondary cathode electrodes is formed on at least a part of each auxiliary electrode of the plurality of auxiliary electrodes that is in contact with the cathode electrode through a contact hole.

2. The organic light emitting display apparatus of claim 1, wherein the plurality of secondary cathode electrodes is formed on the cathode electrode.

3. The organic light emitting display apparatus of claim 2, wherein the cathode electrode and the plurality of auxiliary electrodes are electrically connected to one another by exposing the plurality of secondary cathode electrodes to laser radiation.

4. The organic light emitting display apparatus of claim 1, wherein the each of the plurality of secondary cathode electrodes is formed between each of the plurality of auxiliary electrodes and the cathode electrode.

5. The organic light emitting display apparatus of claim 4, wherein the cathode electrode and the plurality of auxiliary electrodes are electrically connected to one another through the plurality of secondary cathode electrodes by exposing the cathode electrode to laser radiation.

6. The organic light emitting display apparatus of claim 1, wherein the plurality of auxiliary electrodes and the plurality of pixel electrodes are formed on a same plane.

7. The organic light emitting display apparatus of claim 1, wherein the plurality of organic emissive layers is formed in a pattern of islands, and wherein the plurality of auxiliary electrodes is formed in a linear pattern between columns of the plurality of organic emissive layers.

8. The organic light emitting display apparatus of claim 1, wherein the plurality of organic emissive layers are formed in a linear pattern, and wherein the plurality of auxiliary electrodes is formed in a linear pattern between columns of the plurality of organic emissive layers.

9. The organic light emitting display apparatus of claim 1, further comprising a pixel definition layer foamed between adjacent pixel electrodes of the plurality of pixel electrodes, wherein at least parts of the auxiliary electrodes are exposed by the contact holes formed in the pixel definition layer.

10. The organic light emitting display apparatus of claim 1, wherein the contact hole is formed on the periphery of the plurality of organic emissive layers.

11. A method of manufacturing the organic light emitting display apparatus of claim 1, comprising:
   forming a plurality of pixel electrodes corresponding to a plurality of pixels, the plurality of pixel electrodes disposed on a substrate;
   forming a plurality of auxiliary electrodes, wherein each of the plurality of auxiliary electrode is formed on at least a part of a periphery of each of the plurality of pixel electrodes;
   forming a first organic function layer on the substrate, the first organic function layer covering the plurality of pixel electrodes and the plurality of auxiliary electrodes;
   forming an organic emissive layer on the first organic function layer;
   forming a second organic function layer on the substrate covering the organic emissive layer;
   forming a cathode electrode on the substrate, wherein the cathode electrode faces the plurality of pixel electrodes and covers the second organic function layer; and
   forming a plurality of secondary cathode electrodes, wherein each of the plurality of secondary cathode electrodes is formed on at least a part of each of the plurality of auxiliary electrodes that is in contact with the cathode electrode through a contact hole.

12. The method of claim 11, wherein the forming of the plurality of secondary cathode electrodes comprises forming each of the plurality of secondary cathode electrodes on the cathode electrode.

13. The method of claim 12, further comprising electrically connecting the cathode electrode and the plurality of auxiliary electrodes to one another by exposing the plurality of secondary cathode electrodes to laser radiation.

14. The method of claim 11, wherein the forming of the plurality of secondary cathode electrodes comprises forming each of the plurality of secondary cathode electrodes after forming the second organic function layer and before forming the cathode electrode.

15. The method of claim 14, further comprising electrically connecting the cathode electrode and each of the plurality of auxiliary electrodes to one another through the plurality of secondary cathode electrodes by exposing the cathode electrode to laser light.

16. The method of claim 11, wherein the plurality of auxiliary electrodes and the plurality of pixel electrodes are formed on a same plane.

17. The method of claim 11, wherein the organic emissive layer is formed in a pattern of islands, and wherein the plurality of auxiliary electrodes is formed in a linear pattern between columns of the organic emissive layer.

18. The method of claim 11, wherein the organic emissive layer is formed in a linear pattern, and wherein the plurality of auxiliary electrodes are formed in a linear pattern between columns of the organic emissive layer.

19. The method of claim 11, further comprising, after the forming of the plurality of pixel electrodes and the forming of the plurality of auxiliary electrodes and before the forming of the first organic function layer, forming a pixel definition layer comprising openings exposing the plurality of pixel electrodes and contact holes exposing the plurality of auxiliary electrodes.

20. An organic light emitting display apparatus comprising:
   a pixel electrode formed on a substrate; an auxiliary electrode formed on a periphery of the pixel electrode;
   a first organic function layer formed on the substrate and covering the pixel electrode and the auxiliary electrode;
   an organic emissive layer formed on the first organic function layer;
   a second organic function layer formed on the substrate and covering the organic emissive layer;
   a cathode electrode formed on the substrate covering the second organic function layer; and
   a secondary cathode electrode formed on at least a part of the auxiliary electrode and in contact with the cathode electrode through a contact hole.

* * * * *